United States Patent
Deligianni et al.

(10) Patent No.: US 10,396,665 B2
(45) Date of Patent: Aug. 27, 2019

(54) ON-CHIP DC-DC POWER CONVERTERS WITH FULLY INTEGRATED GAN POWER SWITCHES, SILICON CMOS TRANSISTORS AND MAGNETIC INDUCTORS

(71) Applicant: International Business Machines Corporation, Armonk, NY (US)

(72) Inventors: Hariklia Deligianni, Alpine, NJ (US); Devendra K. Sadana, Pleasantville, NY (US); Edmund J. Sprogis, Myrtle Beach, SC (US); Naigang Wang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/713,937

(22) Filed: Sep. 25, 2017

(65) Prior Publication Data
US 2018/0034369 A1 Feb. 1, 2018

Related U.S. Application Data

(63) Continuation of application No. 15/185,807, filed on Jun. 17, 2016, now Pat. No. 9,806,615.

(51) Int. Cl.
*H01L 21/00* (2006.01)
*H01L 27/00* (2006.01)
(Continued)

(52) U.S. Cl.
CPC ........ *H02M 3/158* (2013.01); *H01L 21/7624* (2013.01); *H01L 21/76243* (2013.01);
(Continued)

(58) Field of Classification Search
CPC . H01L 23/535; H01L 23/5227; H01L 23/645; H01L 27/1203; H01L 27/1225;
(Continued)

(56) References Cited

U.S. PATENT DOCUMENTS 5,548,256 A  8/1996 Saito
7,268,410 B1 *  9/2007 Hopper .............. H02M 7/003
                                                257/379
(Continued)

FOREIGN PATENT DOCUMENTS

WO  WO2012154974 A1  11/2012
WO  WO2012176403 A1  12/2012
WO  WO2014170710 A1  10/2014

OTHER PUBLICATIONS

Chumbes et al., "AlGaN/GaN High Electron Mobility Transistors on Si(111) Substrates," IEEE Transactions on Electron Devices, vol. 48, No. 3, pp. 420-426 (Mar. 2001).
(Continued)

*Primary Examiner* — Nikolay K Yushin
(74) *Attorney, Agent, or Firm* — Vazken Alexanian; Michael J. Chang, LLC

(57) ABSTRACT

Fully integrated, on-chip DC-DC power converters are provided. In one aspect, a DC-DC power converter includes: a SOI wafer having a SOI layer separated from a substrate by a buried insulator, wherein the SOI layer and the buried insulator are selectively removed from at least one first portion of the SOI wafer, and wherein the SOI layer and the buried insulator remain present in at least one second portion of the SOI wafer; at least one GaN transistor formed on the substrate in the first portion of the SOI wafer; at least one CMOS transistor formed on the SOI layer in the second portion of the SOI wafer; a dielectric covering the GaN and CMOS transistors; and at least one magnetic inductor formed on the dielectric. A method of forming a fully integrated DC-DC power converter is also provided.

18 Claims, 4 Drawing Sheets

(51) Int. Cl.
*H01L 29/00* (2006.01)
*H02M 3/158* (2006.01)
*H01L 21/768* (2006.01)
*H01L 21/762* (2006.01)
*H01L 21/84* (2006.01)
*H01L 23/535* (2006.01)
*H01L 29/201* (2006.01)
*H01L 27/12* (2006.01)
*H01L 21/8258* (2006.01)
*H01L 23/522* (2006.01)
*H02M 3/00* (2006.01)
*H01L 23/00* (2006.01)
*H01L 27/085* (2006.01)

(52) U.S. Cl.
CPC .... *H01L 21/76895* (2013.01); *H01L 21/8258* (2013.01); *H01L 21/84* (2013.01); *H01L 23/5227* (2013.01); *H01L 23/535* (2013.01); *H01L 27/1203* (2013.01); *H01L 27/1207* (2013.01); *H01L 29/201* (2013.01); *H02M 3/00* (2013.01); *H01L 24/13* (2013.01); *H01L 27/085* (2013.01); *H01L 2224/0401* (2013.01); *H01L 2224/05569* (2013.01); *H01L 2224/131* (2013.01); *H01L 2924/1033* (2013.01); *H01L 2924/10253* (2013.01); *H01L 2924/19104* (2013.01); *Y02B 70/1483* (2013.01)

(58) Field of Classification Search
CPC ......... H01L 27/14641; H01L 27/14636; H01L 29/201; H01L 29/7869; H01L 29/1095; H01L 29/7812; H01L 29/1225; H01L 21/76895; H01L 21/76243; H01L 21/84; H01L 24/13; H01L 27/085; H01L 2224/131; H01L 2224/05569; H01L 2224/0401; H01L 2924/10253; H01L 2924/1033; H01L 2924/19104; H01L 2924/014; H01L 2924/00014; H02M 3/158; H02M 3/07; H02M 3/33546; H02M 3/00; Y02B 70/1483
See application file for complete search history.

(56) References Cited

U.S. PATENT DOCUMENTS

| | | |
|---|---|---|
| 7,772,055 B2 | 8/2010 | Germain et al. |
| 8,212,294 B2 | 7/2012 | Hoke et al. |
| 9,154,045 B2 | 10/2015 | Saunders et al. |
| 2009/0021227 A1 | 1/2009 | Sase et al. |
| 2011/0180857 A1 | 7/2011 | Hoke et al. |
| 2013/0074907 A1 | 3/2013 | Saunders |
| 2013/0088392 A1 | 4/2013 | Saunders et al. |
| 2014/0133202 A1 | 5/2014 | Tamaoka |
| 2014/0191362 A1* | 7/2014 | Gallagher ............... H01L 28/10 257/531 |
| 2015/0155789 A1 | 6/2015 | Freeman et al. |
| 2015/0365003 A1 | 12/2015 | Sadwick |

OTHER PUBLICATIONS

Lee et al., "Fabrication and Analysis of High-Performance Integrated Solenoid Inductor with Magnetic Core," IEEE Transactions on Magnetics, vol. 44, issue 1, pp. 4089-4095 (Nov. 2008).
Zhuang et al., "Study of Magnetic On-Chip Inductors," Proc. SAFE 2001, Nov. 28-29, 2001, Veldhoven, the Netherlands, pp. 229-233.
V. Pala et at, "Integrated high-frequency power converters based on GaAs pHEMT: technology characterization and design examples," IEEE Transactions on Power Electronics, vol. 27, No. 5, pp. 2644-2656 (May 2012).
List of IBM Patents or Applications Treated as Related (2 pages).

* cited by examiner

ON-CHIP DC-DC POWER CONVERTERS WITH FULLY INTEGRATED GAN POWER SWITCHES, SILICON CMOS TRANSISTORS AND MAGNETIC INDUCTORS

CROSS-REFERENCE TO RELATED APPLICATION(S)

This application is a continuation of U.S. application Ser. No. 15/185,807 filed on Jun. 17, 2016, now U.S. Pat. No. 9,806,615, the disclosure of which is incorporated by reference herein.

FIELD OF THE INVENTION

The present invention relates to direct current (DC)-DC power converters, and more particularly, to fully integrated, on-chip DC-DC power converters.

BACKGROUND OF THE INVENTION

A switched-inductor power converter is the most widely used DC-DC power converter topology in power electronics due to its high efficiency, variable conversion ratio, and power-handling ability. A Buck DC-DC power converter can be used to step down voltage from its input/supply to its output/load. Thus Buck converters are also referred to as step-down converters. In Buck converters, an inductor is used to store energy and two switches are used to control the currents flowing in the inductors.

It is desirable for DC-DC power converters to work at high voltages (e.g., greater than 20 volts (V), high power density, and high frequencies (e.g., greater than 10 megahertz (MHz)), while at the same time, achieve high levels of integration for efficient power delivery and fast transient response. The switches for DC-DC power converters are typically silicon-devices, e.g., complementary metal-oxide semiconductor (CMOS) for low voltage (e.g., less than 5V) and discrete silicon (Si)-trench devices for higher voltage (up to 50V). However, Si devices have high on-resistance (Ron) and gate capacitance (Cg), and therefore it is challenging for these devices to achieve high switching frequency and high power density. At the same time, low frequency requires larger passive devices (e.g., inductors), which results in larger converter size and slower transient response.

High-electron-mobility-transistors (HEMTs), such as gallium nitride (GaN) transistors, have high breakdown voltage, low on-resistance, and high operation temperature, which makes them ideal candidates to replace silicon switches for high power, high voltage Buck converters. Meanwhile, on-chip magnetic inductors (closed yoke inductors or solenoidal inductors) can provide the dense energy storage required for integrated power converters to achieve the high level integration for high efficiency power delivery and fast transient response.

Currently, the GaN-switch-based power converters use discrete parts, such as a GaN switch chip, a Si CMOS chip and discrete inductors, then all the parts are assembled on a printed circuit board. This non-integrated structure has a big size, has large parasitics, limited switching frequency, and low efficiency.

Thus, on-chip power converter designs with fully integrated switches and inductors would be desirable.

SUMMARY OF THE INVENTION

The present invention provides fully integrated, on-chip DC-DC power converters. In one aspect of the invention, a DC-DC power converter is provided. The DC-DC power converter includes: a silicon-on-insulator (SOI) wafer having a SOI layer separated from a substrate by a buried insulator, wherein the SOI layer and the buried insulator are selectively removed from at least one first portion of the SOI wafer, and wherein the SOI layer and the buried insulator remain present in at least one second portion of the SOI wafer; at least one gallium nitride (GaN) transistor formed on the substrate in the first portion of the SOI wafer; at least one complementary metal-oxide semiconductor (CMOS) transistor formed on the SOI layer in the second portion of the SOI wafer; a dielectric covering the GaN and CMOS transistors; and at least one magnetic inductor formed on the dielectric.

In another aspect of the invention, a method of forming a DC-DC power converter is provided. The method includes the steps of: providing a SOI wafer having a SOI layer separated from a substrate by a buried insulator; selectively removing the SOI layer and the buried insulator from at least one first portion of the SOI wafer such that the SOI layer and the buried insulator remain present in at least one second portion of the SOI wafer; forming at least one GaN transistor on the substrate in the first portion of the SOI wafer; forming at least one CMOS transistor on the SOI layer in the second portion of the SOI wafer; depositing a dielectric that covers the GaN and CMOS transistors; and forming at least one magnetic inductor on the dielectric.

A more complete understanding of the present invention, as well as further features and advantages of the present invention, will be obtained by reference to the following detailed description and drawings.

DETAILED DESCRIPTION OF PREFERRED EMBODIMENTS

Provided herein are DC-DC power converter structures with fully integrated GaN switches, magnetic inductors, and CMOS power drivers on a single Si substrate. Some advantages of the present converter design include: 1) a smaller converter size (due to the fully integrated design), 2) high efficiency (due to smaller contact resistance loss from interconnect and bonding wires), 3) low noise (due to smaller parasitic effect from interconnect and bonding wires), 4) fast transient response, and 5) low cost fabrication.

Figure 1:
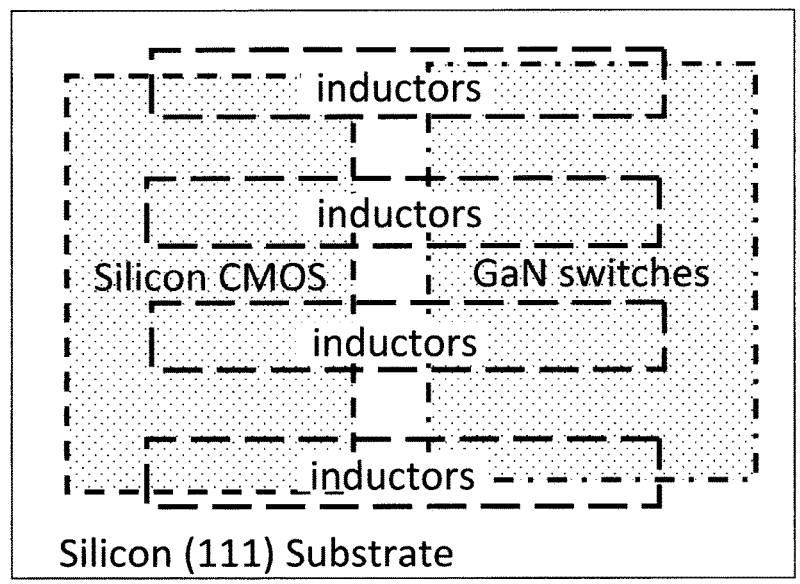
FIG. 1 is a top view schematic diagram of an exemplary fully integrated DC-DC power converter design according to an embodiment of the present invention.

A top view schematic diagram of an example of the present fully integrated converter design is shown in FIG. 1. In the power converter layout shown in FIG. 1, GaN transistors (GaN switches) and CMOS transistors (silicon CMOS) are fully integrated on the front-end-of-line (FEOL) with magnetic inductors (inductors) on the back-end-of-line (BEOL) of a common chip.

Figure 2:
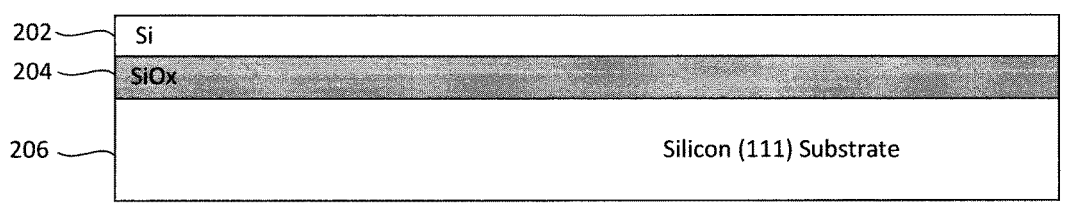
FIG. 2 is a cross-sectional diagram illustrating a starting platform for fabricating the present fully integrated DC-DC power converter which includes a silicon-on-insulator (SOI) substrate having a SOI layer separated from a Si (111) substrate by a buried insulator according to an embodiment of the present invention.

An exemplary methodology for fabricating the DC-DC power converter design of FIG. 1 is now described by way of reference to FIGS. 2-9. As shown in FIG. 2, the process begins with a Si (111) silicon-on-insulator (SOI) substrate. As is known in the art, a SOI wafer includes a SOI layer (e.g., SOI layer 202) separated from a substrate (in this example a Si (111) substrate 206) by a buried insulator (e.g., buried insulator 204). When the buried insulator is an oxide (such as silicon oxide SiOx—see FIG. 2), it is often referred to as a buried oxide or BOX 204. It is notable that the present techniques are not limited to Si (111) substrates. For instance, suitable substrates include, but are not limited to, Si (111), silicon carbide (SiC) and/or sapphire substrates.

The next task is to create a window in the SOI wafer for forming the GaN transistor switches. As will be described in detail below, each of the transistors being formed in the present process will include a source (S), a drain (D), and a gate (G). Creating the GaN transistor window in the SOI wafer generally involves removing portions of the SOI layer 202 and buried insulator 204 in a region of the wafer in which the GaN transistors will be formed. By removing the SOI and buried insulator, the active materials for the GaN transistors can be grown up from the Si substrate 206, as described below.

According to an exemplary embodiment, the process for forming this window involves first forming a patterned mask 302 on the SOI substrate masking/protecting the areas of the substrate outside of the window. See FIG. 3. Any suitable hardmask or softmask material patterned using standard lithography and etching techniques may be employed for mask 302.

Figure 3:
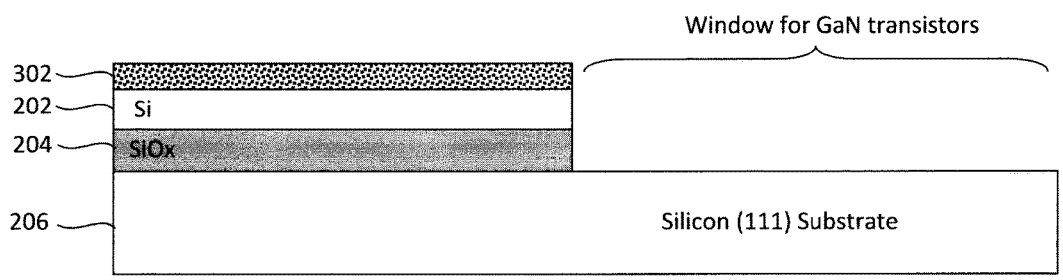
FIG. 3 is a cross-sectional diagram illustrating a patterned mask having been formed on the SOI substrate over the areas of the substrate outside of a window in which one or more GaN transistors will be formed according to an embodiment of the present invention.

As shown in FIG. 3, with the mask 302 in place, an etch is then performed to remove the unmasked portions of the SOI layer 202 and buried insulator 204. By way of a example only, a series of reactive ion etching or RIE steps may be performed to serially remove first the SOI layer 202 (e.g., via a Si-selective RIE chemistry) followed by the buried insulator 204 (e.g., via an oxide-selective RIE chemistry). The underlying Si substrate 206 can serve as an etch stop for the RIE through the buried insulator.

One or more GaN transistors are then formed in the window. Suitable techniques for forming a GaN transistor are described generally, for example, in U.S. Pat. No. 7,772,055 issued to Germain et al., entitled "AgGaN High Electron Mobility Transistor Devices" (hereinafter "U.S. Pat. No. 7,772,055"), the contents of which are incorporated by reference as if fully set forth herein.

Figure 4:
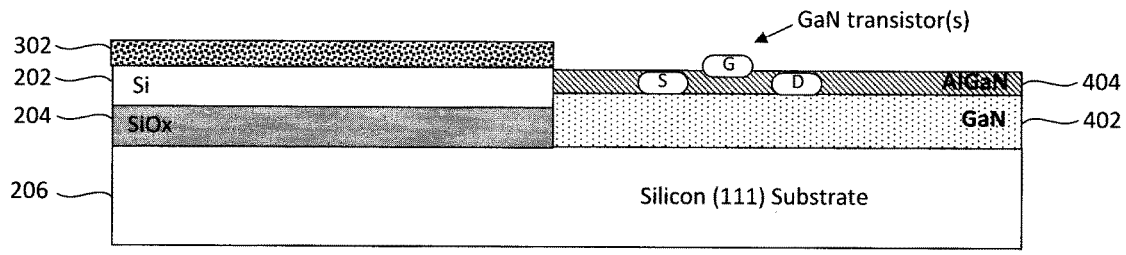
FIG. 4 is a cross-sectional diagram illustrating one or more GaN transistor switches having been formed on the SOI substrate in the window according to an embodiment of the present invention.
Figure 5:
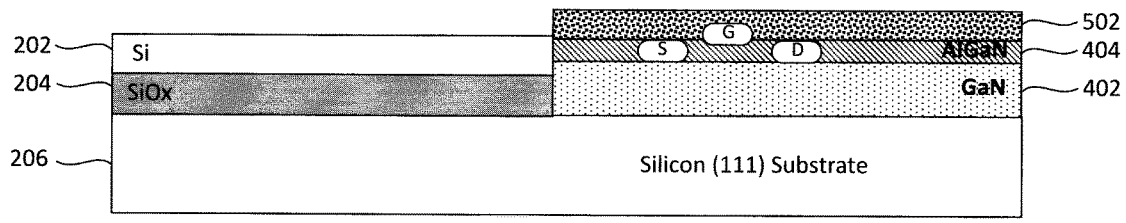
FIG. 5 is a cross-sectional diagram illustrating a patterned mask having been formed over and covering the GaN transistors selective to the remainder of the wafer outside of the window according to an embodiment of the present invention.

As shown in FIG. 4, the process for forming the GaN transistors generally includes first depositing as active materials a layer of GaN 402 on the Si substrate 206, and a higher band gap material (i.e., higher than GaN) 404 on the GaN layer 402. According to an exemplary embodiment, the high band gap material 404 is aluminum gallium nitride (AlGaN). As described, for example, in U.S. Pat. No. 7,772,055, these layers 402 and 404 can be formed on the Si substrate 206 using a vapor phase epitaxy process with trimethylgallium, trimethyl ammonium, ammonia, and silane as precursors. The selection of the Si substrate 206 material can thus be based on the desired growth parameters of these layers. For instance, Si(111) is known to result in high quality epitaxial growth of materials such as GaN. See, for example, Chumbes et al., "AlGaN/GaN High Electron Mobility Transistors on Si(111) Substrates," IEEE Transactions on Electron Devices, vol. 48, no. 3, pgs. 420-426 (March 2001), the contents of which are incorporated by reference as if fully set forth herein.

It is notable that, as shown in FIG. 4, the mask 302 can be kept in place during the growth of the active materials (e.g., GaN/AlGaN) in the GaN transistor window. This will prevent deposition of these materials outside of the window, such as on the SOI layer 202. Further, this mask 302 can remain in place until the GaN transistors have been completed, such as during the source (S), drain (D), and gate (G) contact formation (which can be carried out using standard techniques). See FIG. 4. For illustrative purposes only, a single GaN transistor is shown in the figures. After completion of the GaN transistor(s), the mask 302 can be removed.

It is also notable that, as shown in FIG. 4, as a result of this process of forming a window in the wafer and then filling the window with the active materials for the GaN transistors, the active materials 402/404 for the GaN transistors and the (active layer) SOI layer 202 for the CMOS transistors can end up being level with one another. Thus, according to an exemplary embodiment, these active layers are coplanar with one another (for instance, in the example shown in FIG. 4, a top surface of layer 404 is coplanar with a top surface of SOI layer 202). Having a coplanar surface is advantageous since it provides a flat (non-stepped) topography for building subsequent device levels.

The completed GaN transistors now need protection during subsequent processing steps used to fabricate the CMOS transistors outside of the window. To do so, a patterned mask 502 is next formed over and covering the GaN transistors selective to the remainder of the wafer outside of the window. See FIG. 5. Any suitable hardmask or softmask material patterned using standard lithography and etching techniques may be employed for mask 502.

Figure 6:
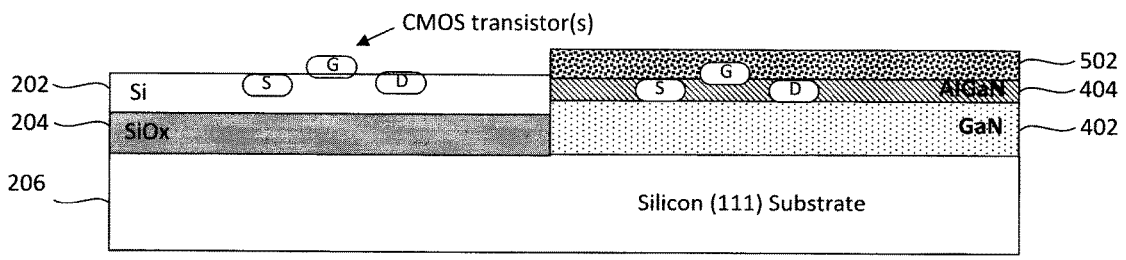
FIG. 6 is a cross-sectional diagram illustrating one or more CMOS transistors having been formed on the SOI layer outside of the window according to an embodiment of the present invention.
Figure 7:
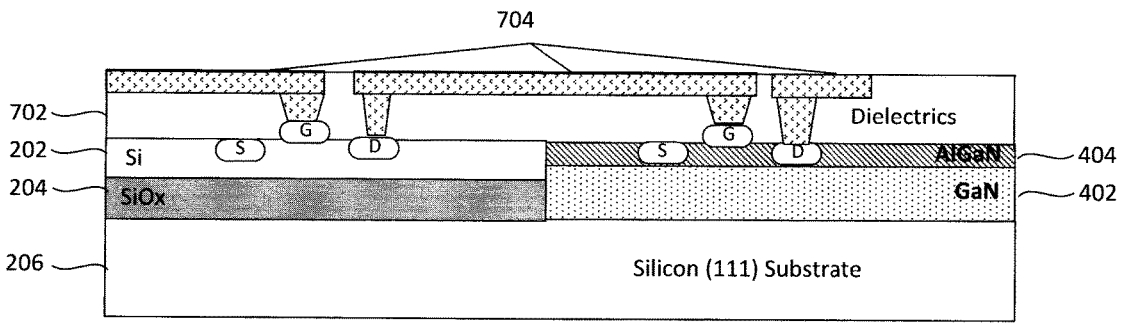
FIG. 7 is a cross-sectional diagram illustrating interconnects having been built to connect the GaN and CMOS transistors according to an embodiment of the present invention.

Next, as shown in FIG. 6, one or more CMOS transistors are formed on the SOI layer 202 outside of the window. For ease and clarity of description, the portion(s) of the SOI wafer in which the GaN transistors are formed (i.e., in the window) may also be referred to herein as a first portion(s) of the SOI wafer, and the portion(s) of the SOI wafer in which the CMOS transistors are formed may also be referred to herein as a second portion(s) of the SOI wafer.

Standard front-end-of-line (FEOL) processes may be employed to fabricate the CMOS transistors. These transistors will serve as the CMOS power drivers in the completed integrated power converter. For illustrative purposes only, a single power driver transistor is shown in the figures. As noted above, each transistor generally includes a source (S), a drain (D), and a gate (G). The mask 502 protects the GaN transistors during the CMOS process and, following fabrication of the CMOS transistors, the mask 502 can be removed.

Next, interconnects 704 are built to connect the GaN and CMOS transistors. See FIG. 7. To form the interconnects 704, a dielectric(s) 702 can be deposited onto the wafer, covering the CMOS and GaN transistors, patterned, and the pattern filled with a suitable conductor (e.g., copper (Cu)) to form the interconnects 704. While dielectric 702 is shown as a single layer, one skilled in the art would recognize that multiple layers of dielectric may be needed to bury the various metal interconnect layers.

Figure 8:
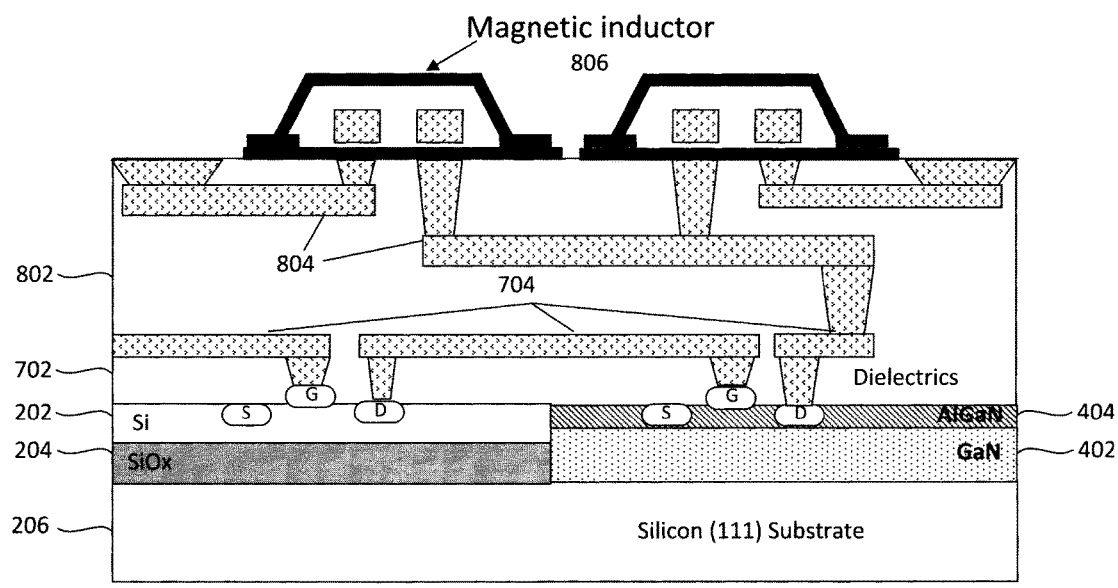
FIG. 8 is a cross-sectional diagram illustrating BEOL wiring and magnetic inductors having been fabricated according to an embodiment of the present invention.

Next, BEOL wiring 804 and magnetic inductors 806 are fabricated. See FIG. 8. As shown in FIG. 8, an additional dielectric(s) 802 is deposited onto the wafer which, in the same manner as described above, is patterned, and the pattern is then filled with a suitable conductor (e.g., Cu) to form the BEOL wiring 804. This BEOL wiring 804 connects, among other things, the GaN transistors with the magnetic inductors 806. A switched mode DC-DC power converter converts DC voltage from one level to another by storing the input energy temporarily, and then releasing that energy at a different voltage. The storage and release may be made from a magnetic field of the magnetic inductor. In the example depicted in the figures, the magnetic inductor has a closed-yoke design. An exemplary process for forming a closed-yoke magnetic inductor is detailed below. However, other magnetic inductor designs may be implemented herein including, but not limited to, solenoidal inductors (which have one magnetic layer instead of the two magnetic layers present in a closed-yoke design). See, for example, Lee et al., "Fabrication and Analysis of High-Performance Integrated Solenoid Inductor with Magnetic Core," IEEE Transactions on Magnetics, vol. 44, issue 1, pgs. 4089-4095 (November 2008), the contents of which are incorporated by reference as if fully set forth herein.

Figure 9:
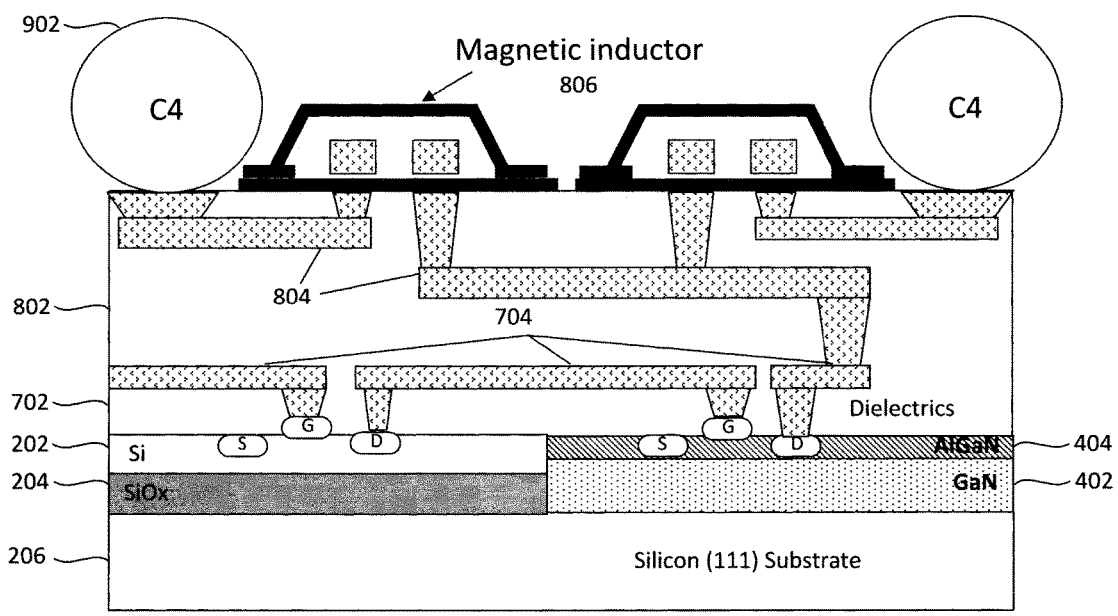
FIG. 9 is a cross-sectional diagram illustrating C4 and other packaging levels having been completed according to an embodiment of the present invention.

Finally, C4 and other packaging levels are completed as shown in FIG. 9. As shown in FIG. 9, C4 solder bumps 902 are formed in contact with the BEOL wiring 804. While shown as large solder bumps, these connects could also be configured as micro-bumps with a denser pitch.

Figure 10:
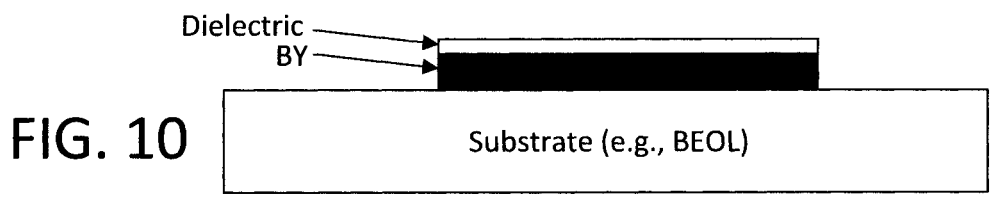
FIG. 10 is a cross-sectional diagram illustrating a starting structure for fabricating a magnetic inductor on the TSV interposer or GaN transistor chip, which includes a bottom yolk (BY) and a dielectric over the BY according to an embodiment of the present invention.
Figure 11:
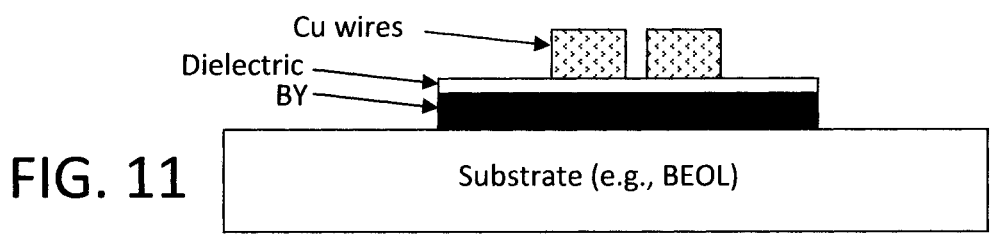
FIG. 11 is a cross-sectional diagram illustrating Cu wires having been plated onto the dielectric according to an embodiment of the present invention.

An exemplary methodology for fabricating a closed-yoke magnetic inductor is now provided by way of reference to FIGS. 10-13. In the above example, the magnetic inductor was formed on the dielectric 802 in contact with the BEOL wiring 804. Thus, dielectric 802 is represented generically in FIGS. 10-13 as a substrate on which the magnetic inductor is built. As shown in FIG. 10, a film of a magnetic material is formed on the substrate. This film will be used to form the bottom yolk or BY. See FIG. 10. Suitable magnetic materials for the bottom (and top) yolk include, but are not limited to, iron (Fe)-based materials, such as iron-tantalum nitride (FeTaN), iron-hafnium oxide (FeHfO), iron-chromium hafnium nitride (FeCrHfN), iron-chromium tantalum nitride (FeCrTaN), iron-chromium nitride (FeCrN), iron-cobalt boron (FeCoB), and combinations thereof. See, for example, Zhuang et al., "Study of Magnetic On-Chip Inductors," Proc. SAFE 2001, Nov. 28-29, 2001, Veldhoven, the Netherlands, pp. 229-233, the contents of which are incorporated by reference as if fully set forth herein. Magnetic materials for the bottom yolk can be deposited onto the substrate using a technique such as sputtering. After deposition, the magnetic film for the bottom yolk is patterned using standard lithography and etching techniques into the footprint and location of the magnetic inductor. See FIG. 10. A dielectric is then deposited onto the bottom yolk BY.

Cu wires are then plated onto the dielectric. See FIG. 11. By way of example only, a standard resist mask plating technique can be used to form the Cu wires, wherein a conventional photolithography and etching process is used to pattern a photoresist (not shown) on the dielectric with the footprint and location of the Cu wires. The photoresist pattern is coated with a thin Cu seed layer (not shown), e.g., by sputtering, which is needed to enable plating of the Cu wires. The pattern is then filled with (e.g., plated) Cu to form the Cu wires, followed by removal of the photoresist and seed Cu layer.

Figure 12:
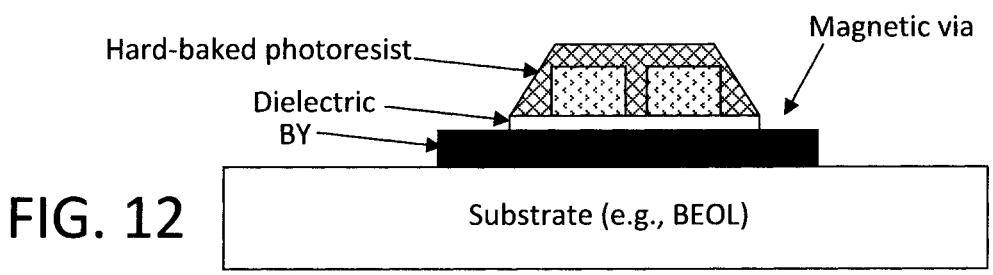
FIG. 12 is a cross-sectional diagram illustrating the Cu wires having been covered with a hard baked photoresist, and magnetic vias having been opened to the BY according to an embodiment of the present invention.
Figure 13:
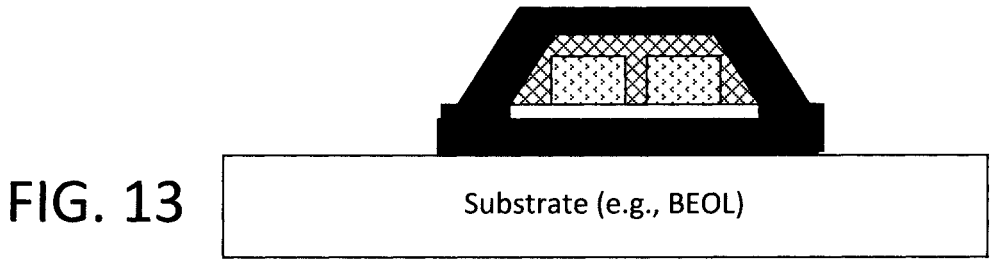
FIG. 13 is a cross-sectional diagram illustrating a top yolk TY of the magnetic inductor having been formed according to an embodiment of the present invention.

As shown in FIG. 12, the Cu wires are then covered with a patterned (e.g., hard baked) photoresist which is then used as a mask to open up the dielectric, forming magnetic vias to the bottom yolk BY. In the same manner as described above for the bottom yolk BY, a suitable magnetic material (see above) is deposited and patterned to form the top yolk (TY) of the magnetic inductor. See FIG. 13.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A DC-DC power converter, comprising:
    a silicon-on-insulator (SOI) wafer having a SOI layer separated from a substrate by a buried insulator, wherein the SOI layer and the buried insulator are selectively removed from at least one first portion of the SOI wafer, and wherein the SOI layer and the buried insulator remain present in at least one second portion of the SOI wafer;
    at least one gallium nitride (GaN) transistor formed on the substrate in the at least one first portion of the SOI wafer;
    at least one complementary metal-oxide semiconductor (CMOS) transistor, formed on the SOI layer in the at least one second portion of the SOI wafer, connected to a gate of the GaN transistor;
    a dielectric covering the GaN and CMOS transistors;
    at least one magnetic inductor formed on the dielectric; and
    metal wiring in the dielectric directly connecting a drain of the GaN transistor with the magnetic inductor.

2. The DC-DC power converter of claim 1, wherein the buried insulator is an oxide.

3. The DC-DC power converter of claim 1, wherein the substrate comprises a material selected from the group consisting of: silicon (111), silicon carbide, sapphire, and combinations thereof.

4. The DC-DC power converter of claim 1, wherein the magnetic inductor is a closed-yoke magnetic inductor.

5. The DC-DC power converter of claim 1, wherein the GaN transistor comprises:
a first active material on the substrate; and
a second active material on the first active material, wherein the second active material has a higher band gap than the first active material.

6. The DC-DC power converter of claim 5, wherein the first active material comprises GaN.

7. The DC-DC power converter of claim 5, wherein the second active material comprises aluminum-gallium-nitride (AlGaN).

8. The DC-DC power converter of claim 5, wherein a top surface of the second active material is coplanar with a top surface of the SOI layer.

9. A method of forming a DC-DC power converter, the method comprising:
providing a SOI wafer having a SOI layer separated from a substrate by a buried insulator;
selectively removing the SOI layer and the buried insulator from at least one first portion of the SOI wafer such that the SOI layer and the buried insulator remain present in at least one second portion of the SOI wafer;
forming at least one GaN transistor on the substrate in the at least one first portion of the SOI wafer;
forming at least one CMOS transistor on the SOI layer in the at least one second portion of the SOI wafer connected to a gate of the GaN transistor;
depositing a dielectric that covers the GaN and CMOS transistors;
forming at least one magnetic inductor on the dielectric; and
forming metal wiring in the dielectric that directly connects a drain of the GaN transistor with the magnetic inductor.

10. The method of claim 9, further comprising:
forming a mask that covers the GaN transistor prior to forming the CMOS transistor.

11. The method of claim 9, wherein the substrate comprises a material selected from the group consisting of: silicon (111), silicon carbide, sapphire, and combinations thereof.

12. The method of claim 9, wherein the magnetic inductor is a closed-yoke magnetic inductor.

13. The method of claim 9, wherein selectively removing the SOI layer and the buried insulator from the at least one first portion of the SOI wafer comprises:
forming a mask that covers only the at least one second portion of the SOI wafer; and
etching the SOI wafer using the mask to selectively remove the SOI layer and the buried insulator from the at least one first portion of the SOI wafer.

14. The method of claim 13, wherein the etching comprises: i) a first etch to selectively remove the SOI layer from the at least one first portion of the SOI wafer, and ii) a second etch to selectively remove the buried insulator from the at least one first portion of the SOI wafer, and wherein the substrate acts as an etch stop for the second etch.

15. The method of claim 9, further comprising:
depositing a first active material on the substrate; and
depositing a second active material on the first active material, wherein the second active material has a higher band gap than the first active material.

16. The method of claim 15, wherein the first active material comprises GaN.

17. The method of claim 15, wherein the second active material comprises AlGaN.

18. The method of claim 15, wherein a top surface of the second active material is coplanar with a top surface of the SOI layer.

* * * * *